(12) United States Patent
Kuang et al.

(10) Patent No.: US 7,760,565 B2
(45) Date of Patent: Jul. 20, 2010

(54) WORDLINE-TO-BITLINE OUTPUT TIMING RING OSCILLATOR CIRCUIT FOR EVALUATING STORAGE ARRAY PERFORMANCE

(75) Inventors: Jente B. Kuang, Austin, TX (US); Jerry C. Kao, Ann Arbor, MI (US); Hung C. Ngo, Austin, TX (US); Kevin J. Nowka, Georgetown, TX (US); Liang-Teck Pang, Albany, CA (US); Jayakumaran Sivagnaname, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 11/781,994

(22) Filed: Jul. 24, 2007

(65) Prior Publication Data
US 2009/0027065 A1  Jan. 29, 2009

(51) Int. Cl.
*G11C 29/00* (2006.01)
*G11C 7/00* (2006.01)
(52) U.S. Cl. .................. 365/201; 365/194; 714/718
(58) Field of Classification Search .................. 365/201
See application file for complete search history.

(56) References Cited

U.S. PATENT DOCUMENTS

| 5,781,469 | A | 7/1998 | Pathak et al. | |
|---|---|---|---|---|
| 6,452,459 | B1 | 9/2002 | Chan et al. | |
| 6,618,309 | B2 * | 9/2003 | DeMaris et al. | 365/207 |
| 7,349,271 | B2 * | 3/2008 | Kuang et al. | 365/201 |
| 7,409,305 | B1 * | 8/2008 | Carpenter et al. | 702/75 |
| 7,414,904 | B2 * | 8/2008 | Ehrenreich et al. | 365/201 |
| 7,668,037 | B2 * | 2/2010 | Carpenter et al. | 365/233.1 |
| 2004/0061561 | A1 | 4/2004 | Monzel et al. | |
| 2005/0063232 | A1 | 3/2005 | Chan et al. | |
| 2005/0078508 | A1 | 4/2005 | Chan et al. | |
| 2005/0204211 | A1 | 9/2005 | Gouin et al. | |
| 2006/0050600 | A1 | 3/2006 | Venkatraman et al. | |
| 2006/0097802 | A1 | 5/2006 | Chan et al. | |
| 2007/0086232 | A1 * | 4/2007 | Joshi et al. | 365/154 |
| 2007/0237012 | A1 * | 10/2007 | Kuang et al. | 365/201 |
| 2008/0104561 | A1 * | 5/2008 | Carpenter et al. | 716/6 |
| 2008/0115019 | A1 * | 5/2008 | Ngo et al. | 714/724 |
| 2008/0155362 | A1 * | 6/2008 | Chang et al. | 714/718 |

FOREIGN PATENT DOCUMENTS

JP  09294055 A  11/1997

* cited by examiner

*Primary Examiner*—Son L Mai
(74) *Attorney, Agent, or Firm*—Mitch Harris, Atty at Law, LLC; Andrew M. Harris; Libby Z. Toub

(57) ABSTRACT

A wordline-to-bitline timing ring oscillator circuit for evaluating storage cell access time provides data on internal bitline access timing, and in particular the total wordline select-to-bitline read output timing. Columns of a storage array are connected in a ring, forming a ring oscillator. The bitline read circuit output of each column is connected to a wordline select input of a next column, with a net inversion around the ring, so that a ring oscillator is formed. The period of oscillation of the ring oscillator is determined by the total wordline select-to-bitline read circuit output timing for a first phase and the pre-charge interval time for the other phase, with the bitline read timing dominating. The circuit may be applied both to small-signal storage arrays, with the sense amplifier timing included within the ring oscillator period, or to large-signal storage arrays, with the read evaluate circuit timing included.

20 Claims, 7 Drawing Sheets

WORDLINE-TO-BITLINE OUTPUT TIMING RING OSCILLATOR CIRCUIT FOR EVALUATING STORAGE ARRAY PERFORMANCE

CROSS-REFERENCE TO RELATED APPLICATIONS

The present application is related to U.S. patent application Ser. No. 11/609,598, entitled "STORAGE CELL DESIGN EVALUATION CIRCUIT INCLUDING A WORDLINE TIMING AND CELL ACCESS DETECTION CIRCUIT" filed on Dec. 12, 2006 and to U.S. patent application Ser. No. 11/682,542, entitled "PULSED RING OSCILLATOR CIRCUIT FOR STORAGE CELL READ TIMING EVALUATION", filed on Mar. 6, 2007. Each of the above-referenced U.S. patent applications have at least one common inventor, are assigned to the same Assignee as the present application, and are incorporated herein by reference.

BACKGROUND OF THE INVENTION

1. Technical Field

The present invention relates generally to memory design evaluation circuits, and more particularly to a ring oscillator circuit for evaluating storage array performance via wordline-to-bitline output timing.

2. Description of the Related Art

Storage cell speed, circuit area and environmental operating ranges, e.g., supply voltage and temperature range, are critical limitations in today's processing systems and are predicted to become even more of a critical limitation as technologies move forward. In particular, static random access memory (SRAM) cells are used in processor caches and external storage to provide fast access to data and program instructions. Static storage cells are also used within processors and other digital circuits for storing values internally, for example, in processor registers.

With processor cycle frequencies reaching well above 4 Ghz, development of SRAM cells that can store and provide access to stored values within that period has become necessary. However, actually measuring the internal wordline-to-bitline timing and in particular the bitline evaluation time of memory cells presents a challenge. In a typical storage cell, there is no mechanism for determining bitline timing margin, except for evaluation performed by timing the read access of the cells after writing different patterns and decreasing the read cycle timing until failure occurs. If a probe is used to attempt to measure the internal timing of a read operation, the probe alters the timing of the cell, yielding incorrect results.

Memory cell transition times involving bitline and wordline read operations, sometimes in combination with write operations, have been evaluated using ring oscillator circuits or cascaded cell delay circuits wherein a large number of cells are cascaded. A ring oscillator may be formed with feedback of an output of the last cell to an input of the first cell, or a one-shot delay may be measured through the cascade of cells. The frequency at which the ring oscillator operates or the one-shot delay indicates the transition time performance, which provides some measure of ultimate operating frequency and access times. Typically, the cell design is then changed in subsequent design iterations having parameters adjusted in response to the results of the ring oscillator test.

However, present ring oscillator circuits and other delay-oriented circuits for performing delay tests typically either are not applied on production dies and/or do not test the actual storage cells under actual bitline loading conditions identical to placement and number of the cells within an array. Further, read cycle measurements are not measured independently, since the inclusion of a cell in the oscillator ring or delay line requires that the cell value will be written in some manner to provide a change in the bitline that is propagated from the previous cell.

It is therefore desirable to provide a test circuit and method for accurately measuring bitline timing under the complete column loading conditions of an actual array. It would further be desirable to measure the wordline-to-bitline access timing under actual loading conditions. It is further desirable to provide such a test circuit that can be integrated within a production storage device.

SUMMARY OF THE INVENTION

The objective of accurately determining bitline timing including wordline-to-bitline access timing, is accomplished in a ring oscillator method and circuit. The method is a method of operating the ring oscillator circuit to measure bitline timing.

The circuit replicates or is integrated within a storage array. The output of a bitline read circuit for a column is coupled to a wordline select input of a next column and the bitline output of the last column is coupled to the wordline select input of the first column. The wordline input-to-bitline output connections have a net inversion around a ring, so that a ring oscillator is formed having a period directly determined by the wordline-to-bitline read output timing and dominated by the bitline timing. The storage cells connected in the ring are initialized to a state such that a pulse is generated at the output of the bitline read circuit in response to the wordline select input of a column and thereby providing a pulse at the wordline select input of the next column. Therefore, the period of oscillation of the ring oscillator is substantially equal to the pre-charge interval plus the wordline input-to-bitline output read timing, multiplied by the number of columns in the ring.

The circuit may be applied in a low-level signal storage array, so that a sense amplifier delay is included in each column's timing, or the circuit may be applied in a high-level signal storage array, so that the read evaluate circuit is included in the ring.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

FIG. 4A is a schematic diagram depicting details of wordline drive circuit 14 of FIG. 1A.

DESCRIPTION OF ILLUSTRATIVE EMBODIMENT

The present invention concerns a test circuit for evaluating bitline read timing of storage cells, e.g., registers or static memory cells, in order to facilitate design improvement and determination of operating and margins. The output of a read circuit of a column is used to trigger a wordline select input, which may be the wordline select of a single column, or may be a next column in a cascade of columns. The wordline inputs and bitline outputs used and tested in the present invention are the local wordline inputs, i.e., the signals that provide the control signals to the pass gates of the storage cells, and local bitline outputs, i.e., the outputs of the sense amplifiers or detection logic that provides the read output value(s) directly from the local bitlines. The storage cells in a row are initialized to a value such that the read circuit output will toggle when the pre-charge state transitions to an evaluate state in response to the wordline select input. A ring oscillator is formed by providing a net inversion around the ring and the frequency of oscillation is measured to determine an indication of the total wordline select input to bitline read circuit output delay. The loading experienced by the cells, bitlines and read sense circuits forming part of the oscillator is identical to that in a production storage array, providing an accurate measure of the wordline-to-read output delays of an actual array implementation. A test die may be implemented that includes the test circuit permanently wired-in-place, or a sacrificial metal can be used to implement the circuit on a production wafer, which can then be modified into an operational circuit via a permanent metal layer that replaces the sacrificial layer. A storage array according to the present invention may also alternatively be implemented on the wafer kerf and discarded after testing. Alternatively, the ring oscillator circuit of the present invention can be selectively enabled in a test mode.

Figure 1A:
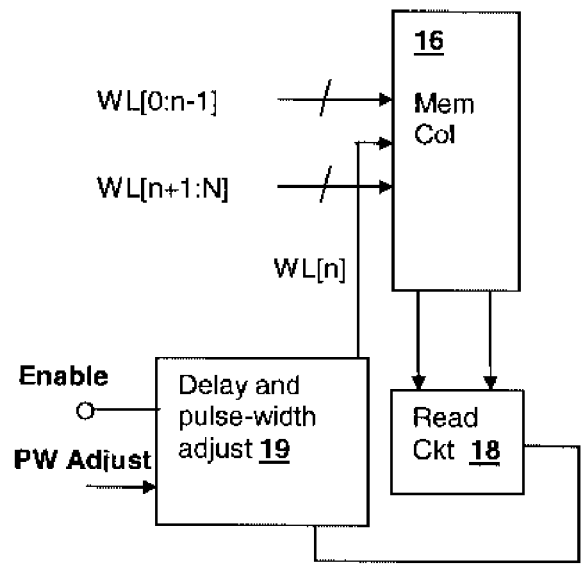
FIG. 1A is a block diagram of an array test circuit in accordance with an embodiment of the invention.

With reference now to the figures, and in particular with reference to FIG. 1A, a block diagram of a storage array column test circuit in accordance with an embodiment of the invention is shown. A single cell in memory column 16 is selected via corresponding wordline select signal WL[n], while other wordline select signals WL[0:n−1] and WL[n+1, N] are held in a disabled condition. Wordline select signal WL[n] is provided from the output of column read circuit 18 through a delay and pulse-width adjustment circuit 19 to form a ring oscillator. Suitable delay and pulse-width adjustment circuits are disclosed in the above-incorporated U.S. patent application "PULSED RING OSCILLATOR CIRCUIT FOR STORAGE CELL READ TIMING EVALUATION", which also describes in detail the need for delay and pulse-width adjustment circuit 19 to regenerate the pulse width in a ring oscillator having a short delay time, such as the single-column test circuit of FIG. 1A. An Enable signal input is provided to start the ring oscillator and a pulse width adjustment value PW Adjust can be provided to adjust the length of an internal delay chain to provide the required pulse width stretching amount to support oscillation. Prior to operation as a ring oscillator, all wordline select inputs WL[0:N] are activated to initialize the storage cells in memory column 16 to a desired state, for example all logical "1"s or logical "0"s to operate under the worst-case bitline loading conditions for each transition of the bitlines.

Figure 1B:
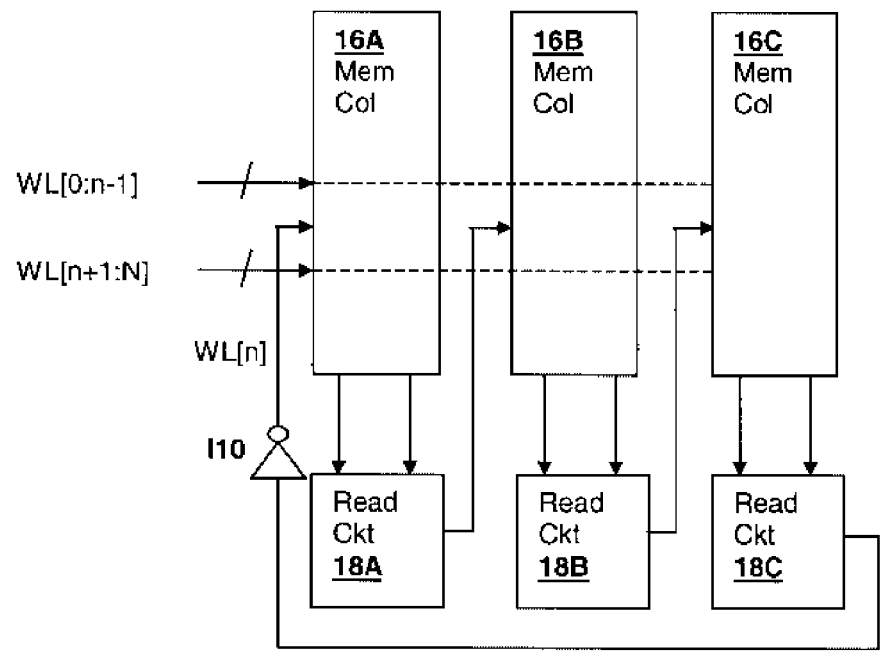
FIG. 1B is a block diagram of an array test circuit in accordance with another embodiment of the invention.

Referring now to FIG. 1B, a block diagram of a storage array column test circuit in accordance with another embodiment of the invention is shown. In the circuit of FIG. 1B, multiple columns 16A-16C are cascaded. The read circuit outputs 18A-18C of each column are connected to wordline select input WL[n] of a next column in a ring, with the output of read circuit 18C of the last column coupled through inverter I10 to wordline select input WL[n] of first column 16A. The frequency of oscillation of the circuit of FIG. 1B has less dependence on the delay of inverter I10 and other wordline circuits (not shown) such as initialization circuits that will be described in further detail below.

Figure 2:
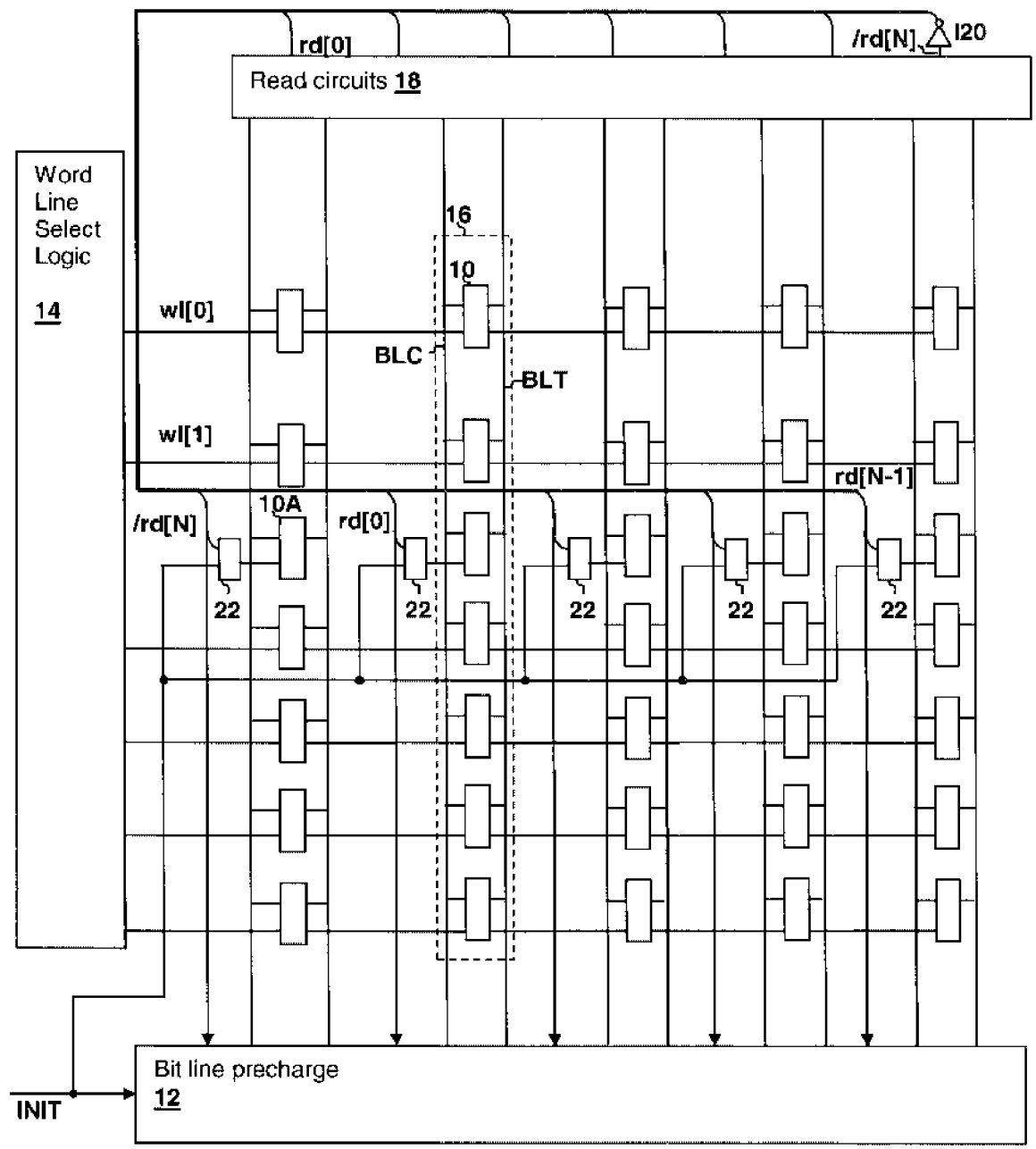
FIG. 2 is a simplified schematic diagram of an array including test circuits in accordance with another embodiment of the invention.

Referring now to FIG. 2, a test array circuit in accordance with another embodiment of the invention is shown. Wordline select logic 14 is connected to the wordline select inputs of each storage cell 10 in the storage array except for a single storage cell 10A in each column 16 for which the wordline-to-bitline timing will be assessed. Wordline select logic 14, which may be operated by a scan chain or by another interface to select individual rows of non-assessed storage cells 10 for initialization, is used to set the state of the non-assessed storage cells 10 to predetermined values. For example, for worst-case loading conditions, the non-assessed storage cells 10 can be set to all "0" or all "1" logical values. Wordline control circuits 22 provide control of the wordline select inputs for the cells 10A in the specified row.

Ring oscillator operation is provided by connecting the output signal rd[n] corresponding to each column provided by read circuits 18, to the input of wordline control circuit 22 of a next column, and initializing storage cells 10A in the specified row so that a state change is produced in the read circuit output signal rd[N] at each of the columns in response to the corresponding wordline select input, so that the state change is propagated around the ring. Inverter I20 is provided to invert the read circuit output signal rd[N] of the last column 16 to provide an input signal to wordline control circuit 22 of the first, forming a ring with a net logic inversion so that the circuit oscillates indefinitely. Wordline control circuits 22 each receive an initialization signal INIT, which provides for activation of the wordline select input of assessed storage cells 10A for the writing of initial values. The initial values of assessed storage cells 10A are all set such that either true bitline BLT or complement bitline BLC will toggle from the pre-charged state such that a pulse will be generated at the output of the corresponding read circuit 18 to enable the wordline select input of the next column. Therefore, wordline control circuits 22 are responsive to read circuit output signals rd[n] provided from the read circuit 18 of the previous column, so that the values stored in assessed storage cells 10A are propagated in the ring oscillator by generating the above-described pulse on the read circuit output signal rd[n+1], which is provided as an input to the next wordline control circuit 22. Bitline precharge circuit 12 receives initialization signal INIT to initiale bitlines BLT and BLC so that the bitlines are properly precharged for writing of initial values into assessed storage cells 10A. Bitline precharge circuit 12 receives the read circuit output signals rd[n], so that bitlines BLT and BLC of each column are held in a pre-charged state until the wordline select inputs of assessed storage cells 10A are activated to cause an evaluate condition (bitline read), which occurs when a logical "0" value has propagated from the output of a previous assessed storage cell 10A to the output of the corresponding read circuit 18 and through the corresponding wordline control circuit 22. Since the read circuits 18 and storage cells 10 are identical to the circuits in a production storage array design being evaluated (or optionally form part of a production storage array with the proper logic or sacrificial metal to disable or remove the ring oscillator circuit), the depicted circuit provides an indication of the total wordline select-to-read output of the actual storage array, with only slight additional delay due to wordline control circuits 22 and inverter I20, which can be accounted for in the measurement analysis.

Figure 3A:
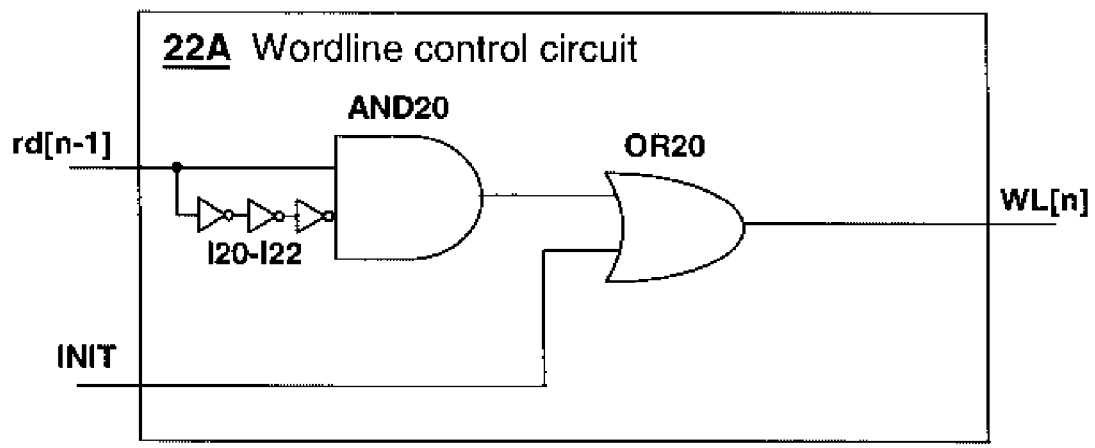
FIGS. 3A-3C are schematic diagrams depicting details of wordline control circuit 22 of FIG. 2, in accordance with alternative embodiments of the invention.
Figure 3B:
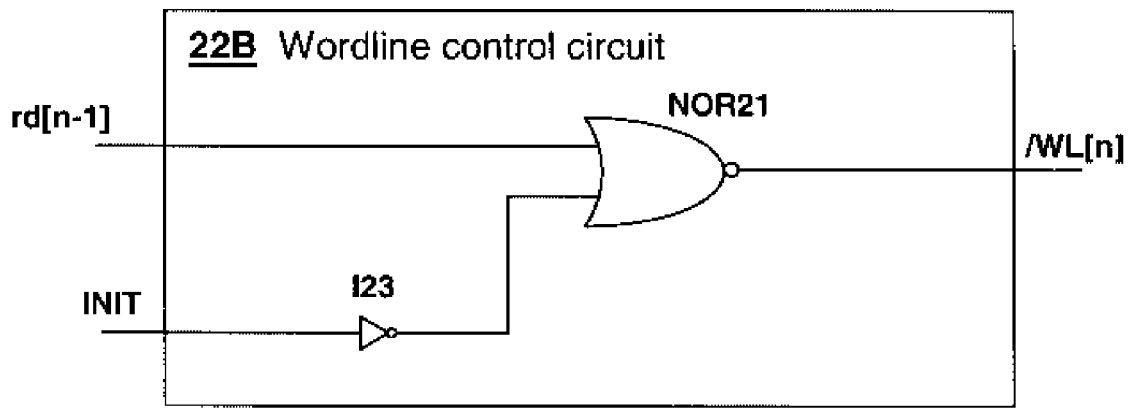
Figure 3C:
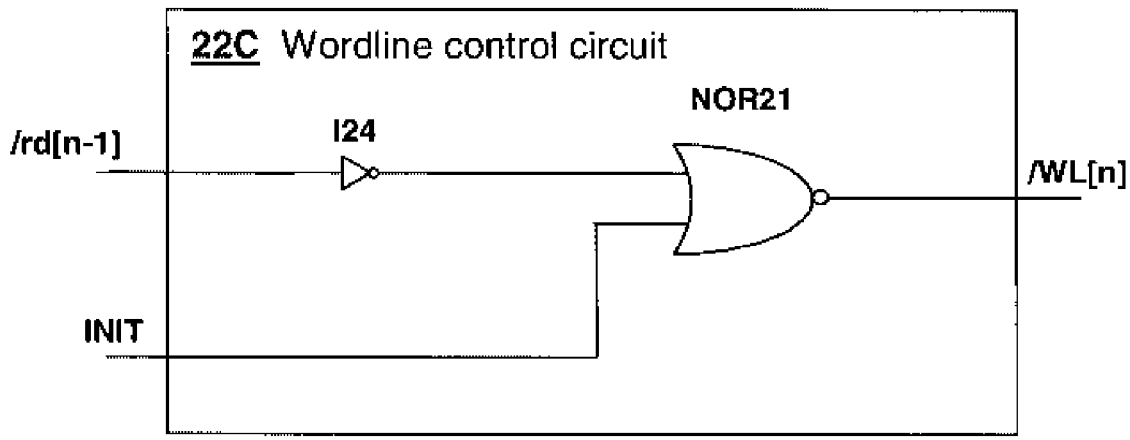

Referring now to FIGS. 3A-3B various circuit that can are used to implement wordline control logic 22 in the array of FIG. 2 are depicted. FIG. 3A shows a wordline control circuit 22A that is used to delay the rising edge of the previous column's read circuit output rd[n−1] via logical-AND gate AND20 and a delay inverter formed by inverters I20-I22 and combines the truncated read circuit output with initialization signal INIT to provide wordline select signal WL[n] as an output. The circuit of FIG. 3A is used when the delay around the ring is very short, for example when a single column delay is being measured as in the circuit of FIG. 1A, so that the read circuit output rd[n−1] is prevented from prematurely commencing a bitline read operation during the pre-charge interval, thus preventing partial pre-charge and potential halting of oscillation. FIG. 3B depicts a more ideal wordline control circuit 22B that is used when the pre-charge time and bitline read delay is sufficient (e.g., when wordline select input/WL [n] is active low as shown) that the previous column's read circuit output rd[n−1] can be directly coupled with minimum delay through logical-NOR gate NOR21. Initialization signal INIT is coupled through an inverter 23 to a logical-NOR gate NOR21 so that assessed storage cells 10A can be initialized in response to the INIT signal. FIG. 3C shows yet another wordline control circuit 22C for use when wordline select input/ WL[n] is active low and the read circuit output rd[n−1] is also active low as programmed by the initialized states of assessed storage cells 10A.

Figure 4A:
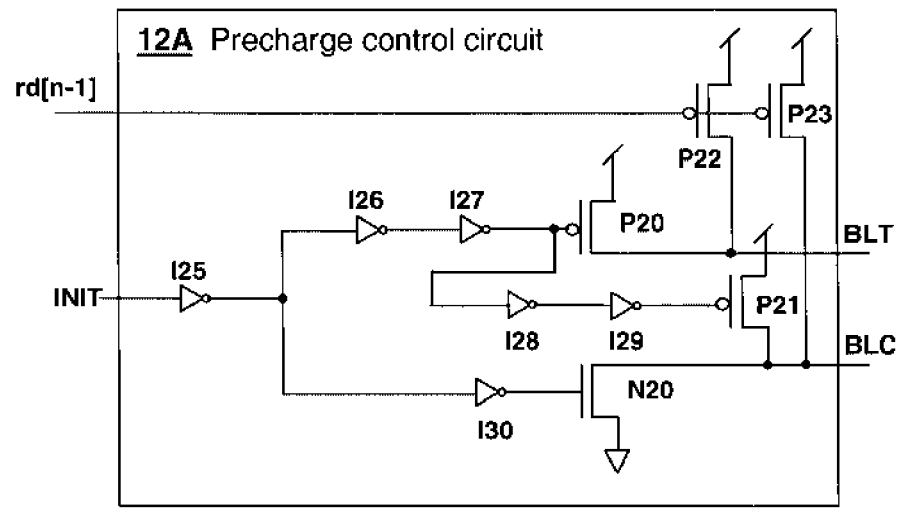
FIG. 4A is a schematic diagram depicting details of a pre-charge control circuit 12A as may be employed in bitline precharge circuit 12 of FIG. 2, in accordance with another embodiment of the invention.

Referring now to FIG. 4A, an exemplary pre-charge control circuit 12A as may be used in the array circuit of FIG. 2, is shown. Since the pre-charge phase of bitlines BLT and BLC must be correctly timed for both the initialization (writing) of assessed storage cells 10A and the ring oscillator operation, initialization signal INIT operates to pre-charge bitlines BLT and BLC to a predetermined complementary state, effecting a write operation by the action of transistors P20 and N20, which are enabled in response to initialization signal INIT through inverters I25-I27 and inverter I30. Inverters I28-I29 have a variable delay and enable transistor P21 a predetermined time after the initialization signal INIT is asserted and after the correct initialization value is written into assessed storage cells 10A, so that bitline BLC is properly restored to a pre-charged state. Transistors P22 and P23 are both activated by the de-asserted state of read circuit output signal rd[n−1] such that pre-charged (non-evaluated) state of the previous column's read circuit output causes bitlines BLT and BLC to pre-charge prior to the next assertion of read circuit output signal rd[n−1] when the assessed storage cell 10A previous column is selected and evaluates to the initialized value.

Figure 4B:
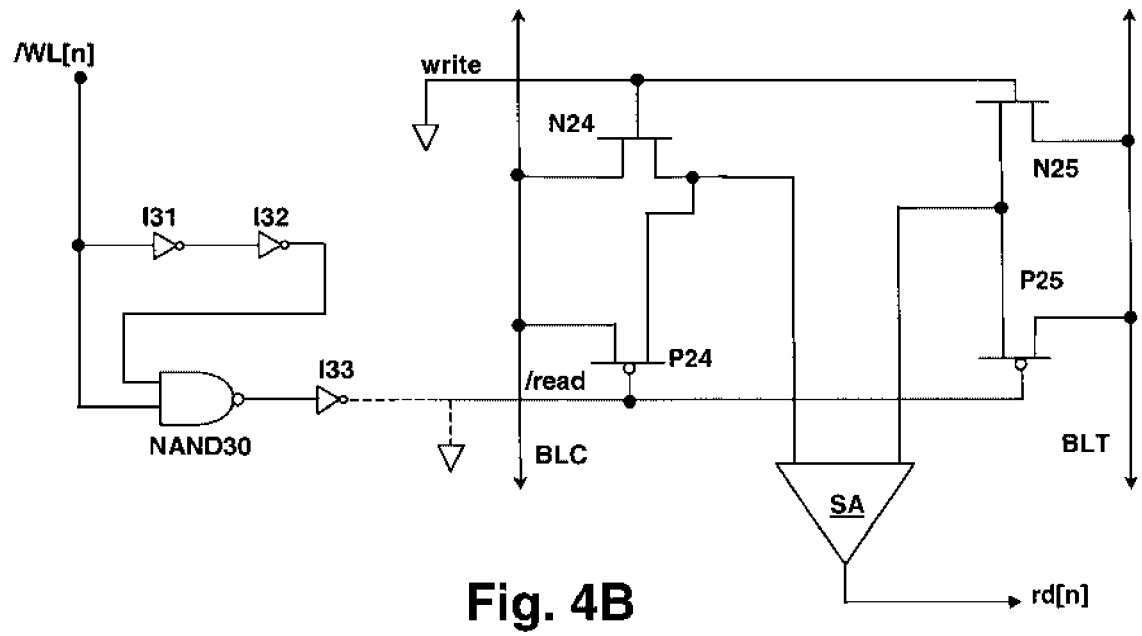
FIG. 4B is a schematic diagram depicting details of a 6T storage cell and wordline access circuit as may be employed in the array of FIG. 2.

Referring now to FIG. 4B, an exemplary bitline switch circuit configuration is shown. FIG. 4B shows a bitline switch comprising transistors N24, N25, P24 and P25, in which transistors P24 and P25 would be generally enabled for a read operation and transistors N24 and N25 would be generally enabled for a write operation in ordinary operation of a storage array. In the ring oscillator circuit of the present invention, the write input to the bitline switch is held low (de-asserted) and the/read input is also held low (asserted) if the bitline timing setup is such that column sense amplifier SA will not be triggered too early. Otherwise, a delayed pulse circuit formed by logical-NAND gate NAND30 and inverters I31-I33 is employed to generate a pulse on the bitline switch/read input, so that transistors P24-P25 are enabled at the proper time to trigger sense amplifier SA.

Figure 5A:
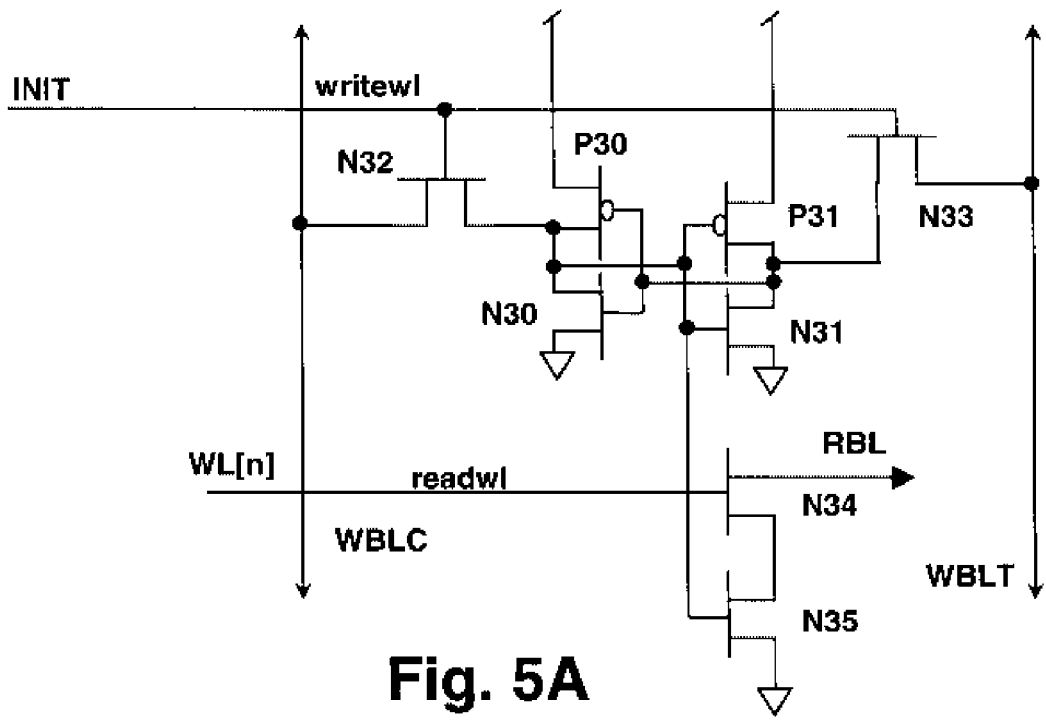
FIG. 5A is a schematic diagram depicting details of an 8T storage cell and wordline access circuit as may be employed in the array of FIG. 2.

Referring now to FIG. 5A, an exemplary assessed storage cell 10A that is used when columns of the array circuit of FIG. 2 have separate read bitlines, is shown. FIG. 5A shows an 8T storage cell having a storage latch formed by transistors N30, P30, N31 and P31, write passgate transistors N32 and N33, and a read circuit formed by transistors N34 and N35. Initialization signal INIT can be supplied directly to the write wordline enable input writew1 to write passgate transistors N32 and N33 and the wordline select signal WL[n] supplied directly to the read wordline enable input readw1 that controls read pass transistor N34, since no special initialization signal control of the read bitline RBL is required. Pre-charging of write bitlines WBLC and WBLT and read bitline RBL is performed automatically in response to the complement of the wordline enable input writew1 and read wordline enable input readw1, respectively, as in a traditional storage array.

Figure 5B:
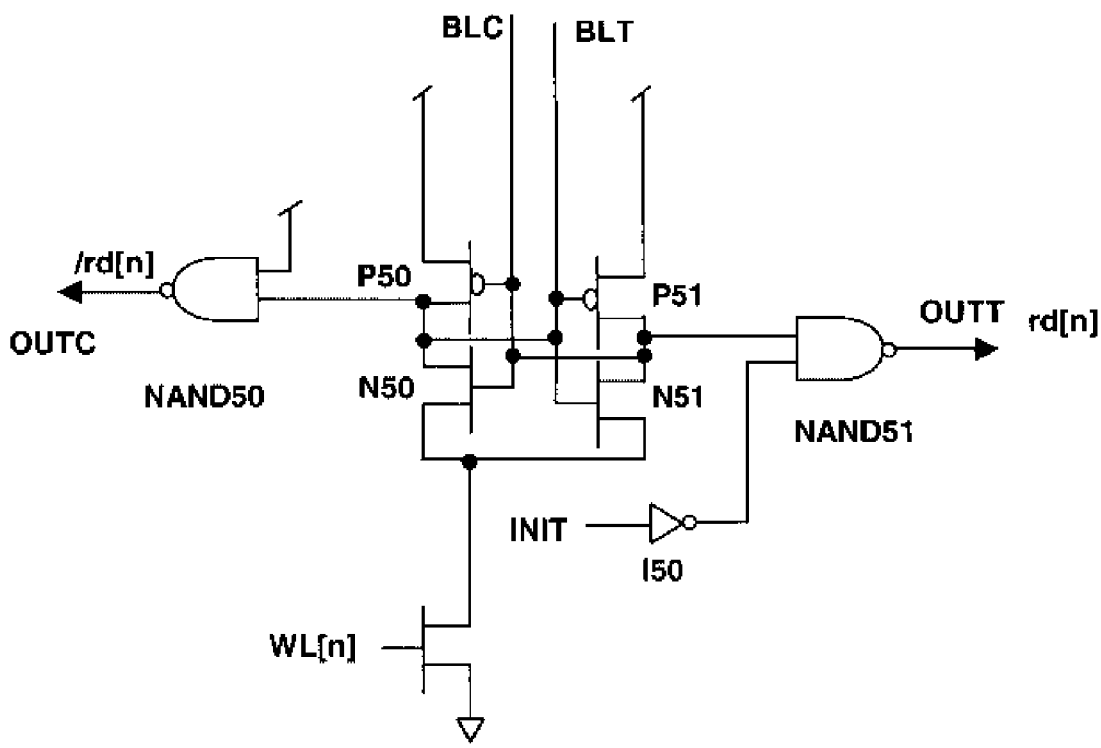
FIG. 5B is a schematic diagram depicting details of a modified sense amplifier as may be employed within read circuits 18 of FIG. 2.

Referring now to FIG. 5B, an exemplary sense amplifier circuit as may be used in read circuits 18 of the array circuit of FIG. 2, is shown. FIG. 5B depicts a cross-coupled sense amplifier formed by transistors N50, P50, N51 and P51, which has been modified to include an enable transistor N52 responsive to the wordline select signal WL[n] provided to the assessed storage cell 10A of the corresponding column. Enable transistor N52 prevents toggling of the output of the sense amplifier until the evaluate phase of the assessed storage cell 10A of the column has commenced. Logical-NAND gate NAND51 is provided, instead of an inverter that would generally be present on the sense amplifier output, to gate the "true" output OUTT of the sense amplifier, so that output OUTT does not change the wordline select input WL[n+1] of the next column in the ring when assessed storage cells 10A are being initialized. Logical-NAND gate NAND50 is also provided to keep the timing of the outputs of the sense amplified symmetrical.

Figure 6:
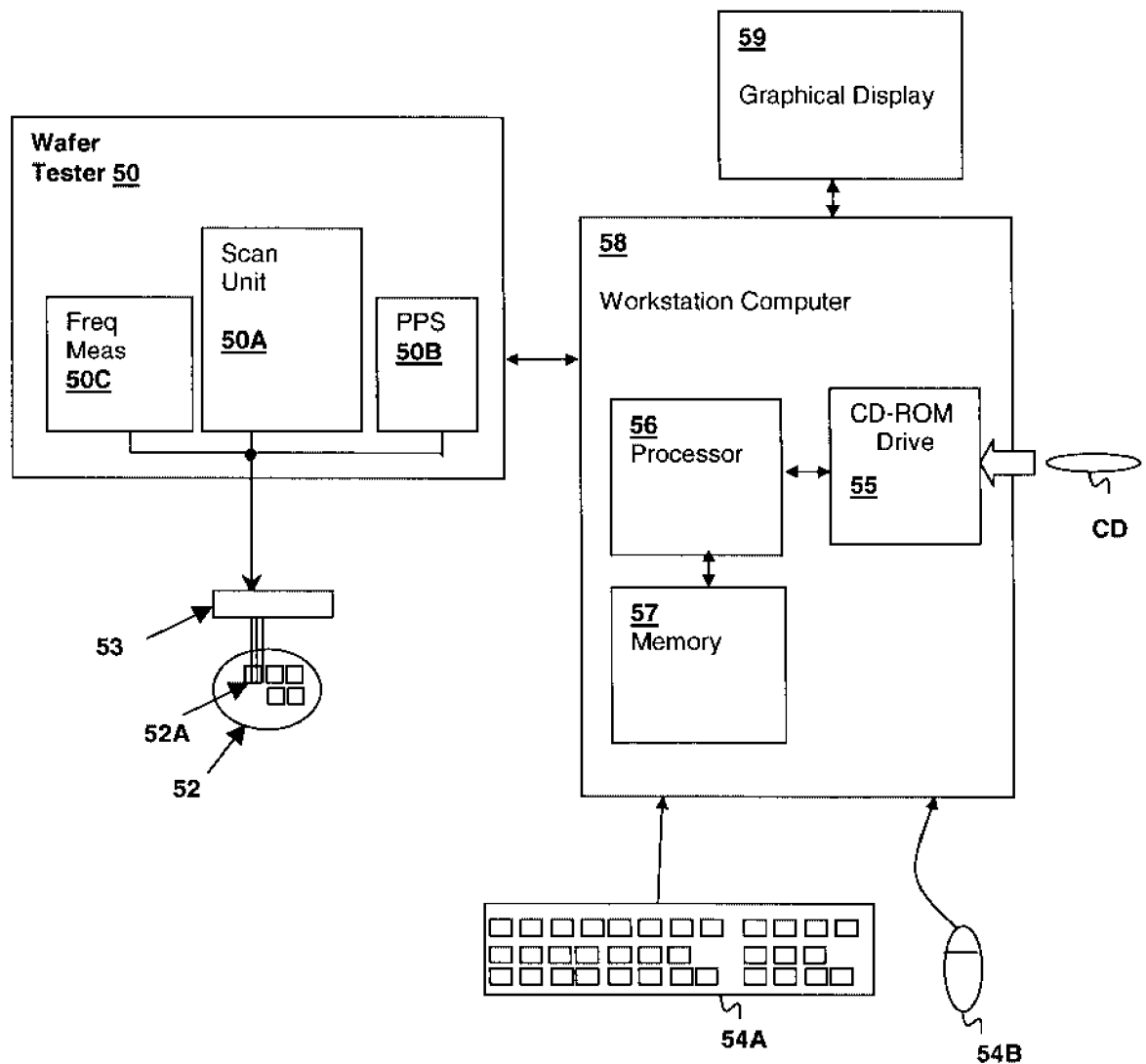
FIG. 6 is a wafer test system in which a method according to the present invention is practiced.

Referring now to FIG. 6, a VLSI wafer test system, in which methods according to an embodiment of the present invention are performed, is depicted. A wafer tester 50 includes a boundary scan unit 50A for providing stimulus to and retrieving data from a die 52A on a wafer under test 52 via a probe head 53 having electrical test connections to die 52A. Wafer tester 50 includes a frequency measurement unit 50C, that evaluates a frequency of the ring oscillator implemented by the test row of assessed storage cells 10A in conjunction with wordline select logic 14 and read circuits 18. Wafer tester 50 also includes a programmable power supply 50B for supplying power supply rail voltages $V_{DD}$ and $V_{OD}$ so that the storage cell supply voltage can be varied during testing.

A workstation computer 58, having a processor 56 coupled to a memory 57, for executing program instructions from memory 57, wherein the program instructions include program instructions for receiving data from wafer tester 50 and/or circuits within wafer 52 in accordance with an embodiment of the present invention, is coupled to wafer tester 50. Generally the methods of the present invention initialize the array values, enable the ring oscillator, count the frequency of oscillation and divide by the number of columns in the ring to obtain the true wordline select-to bitline access delay. Known delay values associated with other circuits in the ring, such as wordline control circuits 22 and inverter I20 may be subtracted from the measured delay, as well. As an alternative to using frequency counter 50C, counters may be included within the die circuits to count the ring oscillator frequency, and the counter values read from scan chains via tester scan unit 50A. Program instructions obtain the counts from wafer tester 50 or read the counts from wafer 52, then process the counts to obtain the wordline select-to-bitline read access delay. The program instructions may be loaded from a storage media such as optical disc CD via a CD-ROM drive 55 or other suitable optical or magnetic/non-volatile memory drive. The data produced by embodiments of the present invention are collected from multiple ring oscillator tests of accessed storage cells 10A within dies 52A as one or more of the power supply voltages are varied by programmable power supply 50B The results of all of the measurements can then be evaluated to either change the design of the array or storage cells 10 (including accessed storage cells 10A), determine whether fabrication process has deviated exceedingly from tolerable norms or to determine operational ranges such as power supply voltage tolerances and access cycle times.

Data from ring oscillator tests in accordance with embodiments of the invention are transferred to workstation computer 58 via wafer tester 50 and stored in memory 57 and/or other media storage such as a hard disk. Workstation computer 58 is also coupled to a graphical display 59 for displaying program output such as the measured frequency and delay results of the memory tests described above. Workstation computer 58 is further coupled to input devices such as a mouse 54B and a keyboard 54A for receiving user input. Workstation computer 58 may be coupled to a public network such as the Internet, or may be a private network such as the various "intra-nets" and software containing program instructions for analyzing data produced by methods and circuits in accordance with embodiments of the present invention may be located on remote computers or locally within workstation computer 58. Further, workstation computer 58 may be coupled to wafer tester 50 by such a network connection.

While the system of FIG. 6 depicts a configuration suitable for sequential test of a plurality of dies on a wafer, the depicted system is illustrative and not limiting to the present invention. Probe head 53 may be a multi-die full wafer probe system, or may comprise multiple probe heads for simultaneously testing multiple wafers on a single or multiple die basis. Additionally, while scan chain data retrieval and stimulus is illustrated, the techniques of the present invention may also be applied to other interfaces available to probe wafer 52, or applied to circuits implemented in fully functional dies where data extraction is performed over a serial or parallel bus or other interface.

Figure 7:
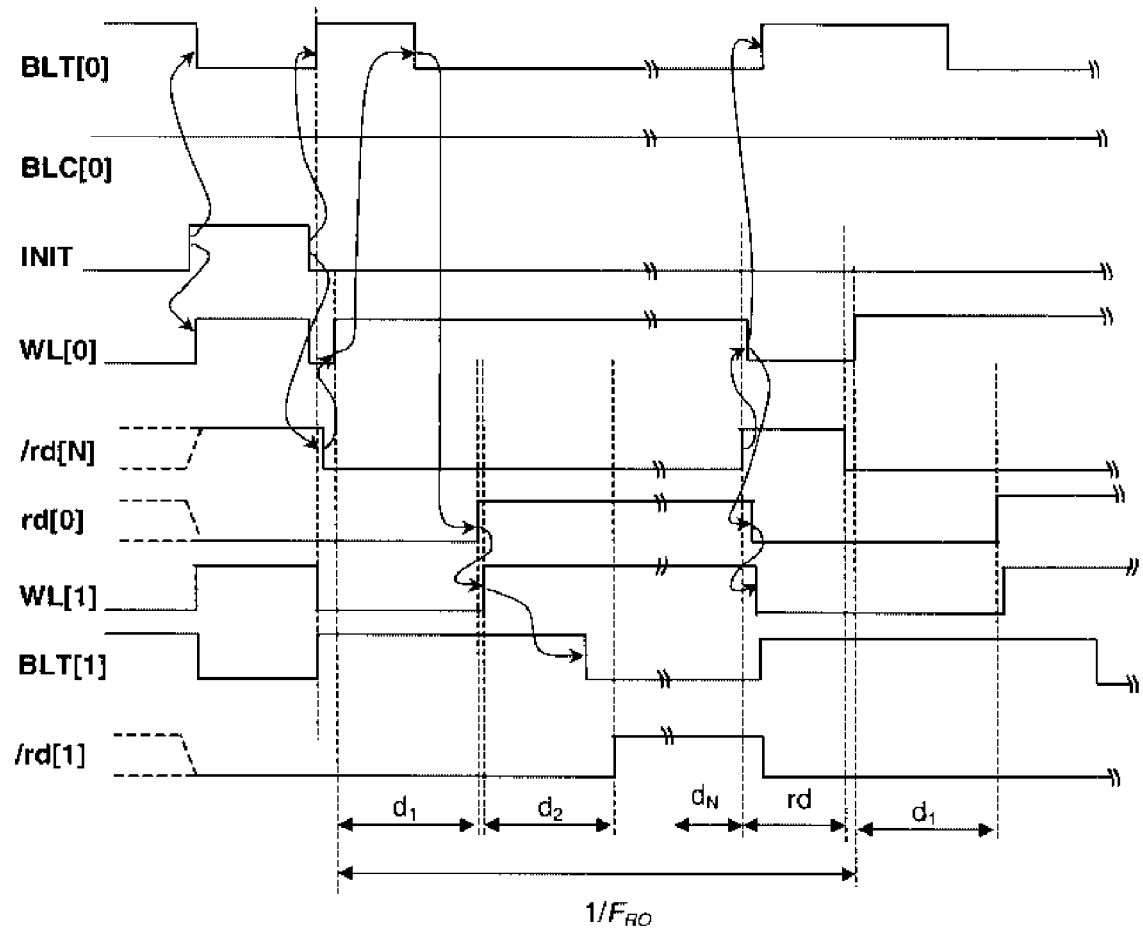
FIG. 7 is a signal timing diagram showing waveforms within a circuit according to an embodiment of the present invention.

Referring now to FIG. 7, signal flow through the above-described test array circuits is shown in a signal timing diagram. During the assertion of initialization signal INIT, bit-lines BLT[n] are forced to "zero" level, and all of the wordline select signals WL[n] for the row of assessed storage cells 10A are asserted, writing a zero to assessed storage cells 10A. When initialization signal INIT is de-asserted, wordline select signals WL[n] are also de-asserted. All of the read circuit outputs rd[n] are low. However, the output of inverter I20, signal /rd[N], which is at a logic high level during the assertion of initialization signal INIT due to the disabling of the sense amplifier in response to initialization signal INIT, transitions to a logic low state, causing assertion of the first wordline select signal WL[0] and beginning a period ($1/F_{RO}$) of oscillation of the ring oscillator. The first wordline select-to-read circuit output delay $d_1$, commences with assertion of the first wordline select signal WL[0], causing an evaluation on the "true" bitline BLT[0] of the first assessed storage cell which further causes the read circuit output of the first column rd[0] to change to a logic high level. Since signal rd[0] controls the next wordline select signal WL[1] through the corresponding wordline control circuit 22, wordline select signal WL[1] is then asserted and the next wordline select-to-read circuit output delay $d_2$ begins. The evaluation ripples through the row of assessed storage cells 10A until the last wordline select-to-read circuit output delay $d_N$ ends, and the output of inverter I20, signal /rd[N], changes to a high logic level.

Signal /rd[N] then disables wordline select signal WL[0], causing a pre-charge of the first assessed storage cell 10A, which disables the output of the sense amplifier of the first column, causing signal rd[0] to fall to a logic low level. The pre-charge phase ripples through the wordline select inputs and sense amplifiers of the columns until the ripple delay rd has passed and signal /rd[N] falls to a logic low level, commencing another cycle of oscillation. Ripple delay period rd is generally a very short interval compared to wordline select-to-read circuit output delays $d_n$ and therefore can either be ignored or estimated along with other delays such as the delay of inverter I20 and wordline control circuits 22 to calculate the true wordline select-to-read circuit output delay from the ring oscillator frequency as $1/NF_{RO}$—additional delay, where $F_{RO}$ is the measured frequency of the ring oscillator.

As an alternative to the above-described frequency measurement methodology, it is understood that a one-shot measurement may be made and one-shot circuit formed by optionally omitting the feedback from the last column to the first column and measuring the time delay of propagation of the initial wordline select input provided from a controllable source, to the arrival of the read output signal from the last column.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A test storage circuit, comprising:
a plurality of identical storage cells forming an array having rows and columns, wherein the storage cells in the columns are connected by bitlines, wherein at least one bitline corresponding to each column is connected to a corresponding one of a plurality of column read circuits for providing a read output signal for each column, and each row has a corresponding wordline select input connected to the storage cells in a corresponding row; and
test control logic for coupling the read output signals to the wordline select inputs of particular storage cells in successive columns, whereby measurement of a propagation delay of a pulse from a wordline select input of the particular storage cell in a first column to a bitline read circuit output of the particular cell of a last column provides a measure of a wordline select-to-bitline read circuit output delay.

2. The test storage circuit of claim 1, wherein the particular storage cells are within a single row of the array.

3. The test storage circuit of claim 1, wherein the bitline read circuit output of the last column is coupled to the wordline select input of the first column, forming a ring oscillator.

4. The test storage circuit of claim 3, wherein the particular storage cells are initialized to a common value such that upon enabling the wordline select input of the particular storage cells, the state of the corresponding bitline read circuit changes from a state corresponding to the pre-charged value of a corresponding bitline, whereby a state change is generated at the wordline select input of a next column.

5. The test storage circuit of claim 1, wherein the test control logic includes wordline control circuits for providing wordline select signals at the wordline select inputs of corresponding ones of the particular storage cells, and wherein the wordline control logic has a first input coupled to receive the read output signal of a preceding column, and a second input for receiving an initialization signal, whereby the wordline select input is activated in response to either the initialization signal or the read output signal of the preceding column.

6. The test storage circuit of claim 1, wherein the column read circuits have enable inputs coupled to the wordline select input of the particular storage cell in the corresponding column, whereby the output of the column read circuits are disabled when the corresponding wordline select input is de-asserted.

7. The test storage circuit of claim 6, wherein the column read circuits further have secondary enable inputs coupled to receive an initialization signal, whereby the outputs of the column read circuits are disabled during initialization of the particular storage cells.

8. The test storage circuit of claim 1, further comprising pre-charge circuits for pre-charging bitlines of corresponding columns, and wherein the pre-charge circuits have inputs coupled to the read output signals of preceding columns, whereby the bitlines of the columns are held in a pre-charge state until the read output signal of the preceding column indicates that the preceding column has evaluated to a non-precharge state.

9. The test storage circuit of claim 1, wherein the plurality of storage cells have an input coupled to at least one separate write bitline by a write pass device, wherein said at least one bitline of said plurality of bitlines is a read bitline, wherein the plurality of storage cells have an output coupled to corresponding read bitlines by a read pass device, wherein the read pass devices of said particular storage cells are coupled to corresponding write select inputs and wherein the write pass devices are coupled to an initialization signal.

10. The test storage circuit of claim 1, further comprising bitline switch circuits for isolating the bitlines from the read circuits of corresponding columns, and wherein a read enable input of the bitline switch circuits is coupled to the wordline select input of the particular storage cell in the corresponding column.

11. The test storage circuit of claim 1, wherein the wordline select input of the particular storage cell in the first column is coupled to the bitline read circuit output of the particular storage cell of the first column to provide a single-storage-cell ring oscillator.

12. A method for measuring characteristics of a storage array, said method comprising:
propagating a pulse from bitline read circuit outputs of columns of the storage array to wordline select inputs of next columns of the storage array; and
measuring an indication of a delay of said pulse from a wordline select input of a first one of the columns to a bitline read circuit output of a last one of the columns, whereby a wordline select-to-bitline read circuit output delay is determined.

13. The method of claim 12, wherein the propagating propagates the bitline read circuit output of the last column to the wordline select input of the first column, whereby a ring oscillator is formed, and wherein the measuring measures a frequency of oscillation of the ring oscillator.

14. The method of claim 12, wherein the propagating comprises injecting a pulse at the wordline select input of the first column, wherein the measuring measures an indication of a delay time from injecting to arrival of the pulse at the bitline read circuit output of the last column.

15. The method of claim 12, further comprising:
prior to the propagating and measuring, activating wordline select inputs of the columns; and
setting the state of bitlines of the storage array to a predetermined state, whereby the state of the cells in the storage array are preset.

16. A test workstation computer system, comprising a processor for executing program instructions, a memory coupled to the processor for storing the program instructions, and wafer test interface for stimulating and probing a die on a wafer, wherein the program instructions comprise program instructions for:
enabling a logical connection from bitline read circuit outputs of columns of a storage array to wordline select inputs of next columns of the storage array; and
measuring an indication of a delay of a pulse from the wordline select input of a first one of the columns to a bitline read circuit output of a last one of the columns, whereby a wordline select-to-bitline read circuit output delay is determined.

17. The test workstation computer system of claim 16, wherein the program instructions for enabling enable the logical connection to couple the bitline read circuit output of the last column to the wordline select input of the first column, whereby a ring oscillator is formed, and wherein the program instructions for measuring measure a frequency of oscillation of the ring oscillator.

18. The test workstation computer system of claim 16, wherein the program instructions for enabling cause injection of a pulse at the wordline select input of the first column, wherein the program instructions for measuring measure an indication of a delay time from injecting to arrival of the pulse at the bitline read circuit output of the last column.

19. A computer program product comprising computer-readable storage media for encoding program instructions for execution on a test workstation computer coupled to a wafer test interface, wherein the program instructions comprise program instructions for:
enabling a logical connection from the bitline read circuit outputs of columns of a storage array to wordline select inputs of next columns of the storage array; and
measuring an indication of a delay of a pulse from the wordline select input of a first one of the columns to a bitline read circuit output of a last one of the columns, whereby a wordline select-to-bitline read circuit output delay is determined.

20. The computer program product of claim 19, wherein the program instructions for enabling enable the logical connection to couple the bitline read circuit output of the last column to the wordline select input of the first column, whereby a ring oscillator is formed, and wherein the program instructions for measuring measure a frequency of oscillation of the ring oscillator.

* * * * *